US005783654A

United States Patent [19]
Sezi et al.

[11] Patent Number: 5,783,654
[45] Date of Patent: *Jul. 21, 1998

[54] PREPARATION OF POLY-O-HYDROXYAMIDES AND POLY O-MERCAPTOAMIDES

[75] Inventors: Recai Sezi; Hellmut Ahne, both of Roettenbach, Germany

[73] Assignee: Siemens Aktiengesellschaft, Munich, Germany

[*] Notice: The term of this patent shall not extend beyond the expiration date of Pat. No. 5,750,638.

[21] Appl. No.: 705,575

[22] Filed: Aug. 29, 1996

[30] Foreign Application Priority Data

Aug. 31, 1995 [DE] Germany ............ 195 32 139.1

[51] Int. Cl.$^6$ .......................... C08G 73/10; C08G 69/08
[52] U.S. Cl. .................. 528/310; 528/170; 528/176; 528/182; 528/184; 528/207; 528/208; 528/312; 528/314; 528/322; 528/328; 528/332; 528/336; 528/363; 528/374
[58] Field of Search .................... 528/328, 310, 528/322, 312, 314, 184, 170, 182, 176, 207, 208, 336, 374, 332, 363

[56] References Cited

U.S. PATENT DOCUMENTS

| 4,331,592 | 5/1982 | Wissmann et al. | 260/112.5 |
|---|---|---|---|
| 4,339,521 | 7/1982 | Ahne et al. | 430/192 |
| 4,622,285 | 11/1986 | Ahne | 430/322 |
| 4,849,051 | 7/1989 | Ahne et al. | 156/659.1 |
| 5,021,320 | 6/1991 | Mueller et al. | 430/192 |
| 5,037,720 | 8/1991 | Khanna | 430/190 |
| 5,096,999 | 3/1992 | Hellmut et al. | 528/182 |
| 5,194,568 | 3/1993 | Gregory et al. | 528/184 |
| 5,219,981 | 6/1993 | Gregory et al. | 528/377 |

FOREIGN PATENT DOCUMENTS

| 0 023 662 | 5/1983 | European Pat. Off. |
| 0 158 726 | 10/1985 | European Pat. Off. |
| 0 264 678 | 4/1988 | European Pat. Off. |
| 0 391 196 | 10/1990 | European Pat. Off. |
| 0 481 402 | 4/1992 | European Pat. Off. |
| 0 291 779 | 7/1994 | European Pat. Off. |
| 3 716 629 | 12/1988 | Germany |

OTHER PUBLICATIONS

Labadie, J. et al., "Recent Advances in High Temperature Polymers For Microelectronic Applications," *SAMPE Journal*, vol. 25, No. 6, Nov./Dec. 1989, pp. 18–23.

Soane, D. et al., "Resists in Microlithoraphy," *Polymers in Microelectronics Fundamentals and Applications*, Amsterdam–Oxford–New York–Tokyo (1989), pp. 77–124.

Rutter, E.W. et al., "A Photodefinable Benzocyclobutene Resin For Thin Film Microelectronic Applications," *Proceedings of the 1992 International Conference on Multichip Modules*, Apr. 1–3, 1992 Radisson Hotel Denver, pp. 394–400.

Mercer, F., "Aromatic Poly(ether imide oxadiazole)s," *High Performance Polymers*, vol. 4, No. 2 (1992), pp. 73–80.

Ahne, H. et al., "Recent Advances in Photosensitive Polyimides," *Polymers for Advanced Technologies*, vol. 4 (1993), pp. 217–233.

Primary Examiner—P. Hampton-Hightower
Attorney, Agent, or Firm—Kenyon & Kenyon

[57] ABSTRACT

In a process for the preparation of poly-o-hydroxyamides and poly-o-mercaptoamides, a bis-o-aminophenol or a bis-o-aminothiophenol is reacted with a dicarboxylic acid ester with the following structure:

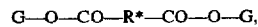

G—O—CO—R*—CO—O—G, where G is an (optionally substituted) succinimide or maleinimide group and R* is the parent body of the dicarboxylic acid.

10 Claims, No Drawings

PREPARATION OF POLY-O-HYDROXYAMIDES AND POLY O-MERCAPTOAMIDES

BACKGROUND OF THE INVENTION

1. Field of the Invention

The invention relates to a process for the preparation of poly-o-hydroxyamides (polybenzoxazole precursors) and poly-o-mercaptoamides (polybenzothiazole precursors).

2. Description of Related Art

Highly thermoresistant polymers are required in microelectronics, particularly as protective and insulating coatings and as dielectrics (see, for example, "SAMPE Journal" 25, No. 6, pp. 18–23 (1989) and "Proceedings of the 1992 International Conference on Multichip Modules", pp. 394–400). Some of the polymers used, such as homo- and copolymers of aromatic polyethers and precursors of polyimides (PI) and polybenzoxazoles (PBO) show a good solubility in organic solvents and good film-forming properties and can be applied to electronic components by means of spin-coating technology (see, for example, "High Performance Polymers" 4, No. 2, pp. 73–80 (1992) and "Polymers for Advanced Technologies" 4, pp. 217–233 (1993).

By means of a temperature treatment, polymer precursors of the above-mentioned type are cyclized, i.e., converted to the corresponding polymers (PI or PBO); this results in the final properties. This is because, as a result of the cyclization, the hydrophilic groups of the poly-o-hydroxyamide disappear, i.e., the NH, OH, and CO groups, which would have a negative effect on the dielectric properties and the water absorption. This is, for example, a significant advantage of the polybenzoxazoles as compared with the polyimides (with two CO groups per imide unit) and, in particular, as compared with the hydroxypolyimides (with two CO groups and one OH group per imide unit). In addition, the cyclization is important not only for the good dielectric properties and the low water absorption of the end product but also for its high temperature stability.

PI and PBO precursors can, for example, be adjusted photosensitively by the addition of suitable photoactive components and can then be structured directly, i.e., without the use of an auxiliary resist. This is important for the reason that direct structuring—as compared with indirect structuring—offers considerable cost advantages.

In contrast to most photosensitive PI precursors, photosensitive PBO precursors offer the advantages of a positive structurability, such as a lower defect density in the structuring of the so-called "via holes", because—in comparison with negative operating systems—only a fraction of the surface is exposed to light. The use of alkali-soluble PBO precursors also results in the possibility of an aqueous alkaline development. After the photostructuring, the cyclization of the precursors is then carried out by annealing.

PBO precursors that can be developed in aqueous alkaline medium are already known (see European Patent 0 023 662, European Application 0 264 678, and European Patent 0 291 779). The photolithographic process used, except for the cyclization, is the same as in the structuring of known positive resists based on novolaks and quinone azides, a process that is used in numerous production lines worldwide (see, for example, D. S. Soane and Z. Martynenko: "Polymers in Microelectronics—Fundamentals and Applications", Elsevier, Amsterdam (1989), pp. 77–124).

The solubility of the PBO precursors in alkalies is an important requirement for their use as base polymers for photosensitive dielectrics that can be developed in aqueous alkalies. For microelectronic uses, the precursors must be soluble in developers free of metal ions, so that developers of this type can also be used in the photostructuring. This is because developers containing metal ions can have a negative effect on the electrical operation of the components.

The most common method for the preparation of alkali-soluble PBO precursors, i.e., of poly-o-hydroxyamides, is the reaction of a dicarboxylic acid chloride with a suitable bis-o-aminophenol. To capture the hydrogen chloride formed in the reaction, a soluble base, such as pyridine, is added, as a rule (see European Application 0 264 678 and European Patent 0 291 779). Although it is possible, by means of this method, to prepare precursors that are soluble in aqueous alkaline developers free of metal ions, there is the disadvantage that chloride ions remain in the polymer. However, a polymer of this type can not be used as a coating material for microelectronic components, because the chloride ions cause corrosion and can thus strongly impair the operation of the components. A purification of the polymer by means of ion exchangers is therefore required. However, this purification is time-consuming and expensive, as it includes additional process stages, such as the preparation of the ion-exchange column, dissolution of the polymer, passage of the solution through the column and rewashing, and repetition of the precipitation and drying.

In the preparation of poly-o-hydroxyamides, it is also necessary to meet the requirement that the dicarboxylic acid chloride react predominantly with the amino groups of the bis-o-aminophenol (with amide formation), but not with its hydroxyl groups (with ester formation), i.e., the reaction selectivity of the amide formation must be high as compared with that of the ester formation. If the ester formation can not be excluded or strongly suppressed, then this will lead to insufficiently alkali-soluble polymers. A low reaction selectivity can also lead to a gel formation in the polymer solution, as a result of which the poly-o-hydroxyamide produced then becomes unfilterable and thus useless.

Processes for the chloride-free synthesis of poly-o-hydroxyamides—and also of poly-o-mercaptoamides—have also already been described. Thus, it is known, from European Application 0 158 726, to react dihydroxy- and dimercapto-diamino compounds with a dicarboxylic acid in the presence of a carbodiimide. However, in this reaction, urea residues remaining on the resin as a result of a rearrangement reaction frequently present problems. This is because they reduce the thermal stability of the polybenzoxazole or polybenzothiazole and the quality of the coatings prepared from these. In addition, the polymers produced by this process are not sufficiently soluble in aqueous alkaline developers free of metal ions.

An alternative chloride-free production process for poly-o-hydroxyamides consists of using condensation reagents, such as 1-ethoxycarbonyl-2-ethoxy-1,2-dihydroquinoline and 1,1'-carbonyldioxydi-1,2,3-benzotriazole (see European Application 0 391 196) for the reaction of the dicarboxylic acid with the bis-o-aminophenol. However, the polymers produced in this manner also show an insufficient solubility in aqueous alkaline developers free of metal ions.

Processes are also known in which the amide formation takes place by means of phosphorus compounds (see: European Application 0 481 402, U.S. Pat. No. 4,331,592, and German Application 3,716,629). However, in the case of poly-o-hydroxyamides, syntheses of this type lead either to cyclized, i.e. alkali-insoluble, products, or phosphorus-containing, in part also chemically bonded, residues remain in the polymer, as a result of which the polymer, because of the doping properties of phosphorus, becomes unusable for microelectronic applications. This is because, in contrast to ionic impurities, residues of this type can not be removed, e.g., by means of ion exchangers.

It is the object of the invention to indicate an economical process by means of which—in a chloride-free manner— poly-o-hydroxyamides and poly-o-mercaptoamides that are soluble in aqueous alkaline developers free of metal ions can be prepared.

According to the invention, this is achieved by reacting a bis-o-aminophenol or a bis-o-aminothiophenol with a dicarboxylic acid ester having the following structure:

G—O—CO—R*—CO—O—G, where:

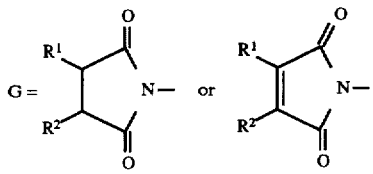

where

R$^1$ and R$^2$=H, F, CH$_3$, or CF$_3$ (independently of each other);

R* has the following meaning:

—(CR$_2$)$_m$, where R=H, F, CH$_3$, or CF$_3$ and m=1 to 10;

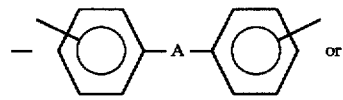

where A=(CH$_2$)$_n$, (CF$_2$)$_p$, C(CH$_3$)$_2$, C(CF$_3$)$_2$, C(CH$_3$) (C$_6$H$_5$), C(CF$_3$) (C$_6$H$_5$), C(CF$_3$) (C$_6$F$_5$), C(C$_6$H$_5$)$_2$, CF$_2$—CF (CF$_3$), CH=CH, CF=CF, C≡C, O—C$_6$H$_4$—O, O, S, CO, or SO$_2$, where n=0 to 10 and p=1 to 10 ;

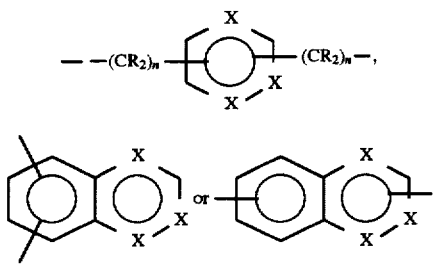

where
X=CH or N,
R=H, F, CH$_3$, or CF$_3$,
and n=0 to 10;

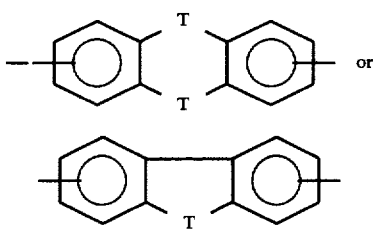

where T=CH$_2$, CF$_2$, CO, O, S, NH, or N(CH$_3$);

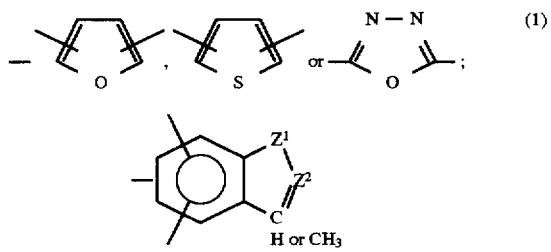

where
(a) Z$^1$=CH$_2$ or CH(CH$_3$) and Z$^2$=CH or C(CH$_3$)
(b) Z$^1$=CH$_2$ or CH(CH$_3$) and Z$^2$=N
(c) Z$^1$=NH or N (CH$_3$) and Z$^2$=CH or C(CH$_3$)
(d) Z$^1$=NH or N (CH$_3$) and Z$^2$=N

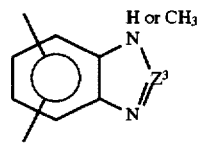

where
(a) Z$^3$=CH or C(CH$_3$)
(b) Z$^3$=N

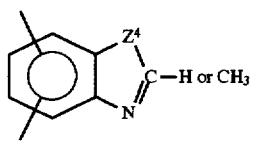

where
(a) Z$^4$=O
(b) Z$^4$=S;

where, in each case, all hydrogen atoms (H) in all aromatic partial structures can be replaced by fluorine (F).

SUMMARY OF THE INVENTION

The invention solves the problem described above by using as the dicarboxylic acid component special esters, namely esters with N-hydroxyimides. Surprisingly, this results in an adequate selectivity of the amide formation. This is because the polymers prepared according to the invention, i.e., the poly-o-hydroxyamides and poly-o-mercaptoamides, are soluble in aqueous alkaline developers free of metal ions. In addition, the process according to the invention takes place without gel formation, so that the above-mentioned polymers are readily soluble and processable in organic solvents. Also, impurities such as chloride and metal ions and phosphorus compounds are avoided in this process.

Special esters containing imide groups, namely esters of dicarboxylic acids and N-hydroxyimides, in the form of N-hydroxysuccinimide and N-hydroxymaleinimide and of derivatives of these compounds are used for the synthesis of the polymers; N-hydroxysuccinimide (N-hydroxysuccinic acid imide) is particularly preferred. A series of esters of this type is the object of the simultaneously filed German Patent Application, File Number 195 32 138.3 "New Dicarboxylic Acid Derivatives" (GR 95 P 3618).

Esters of dicarboxylic acids, such as 1,3-benzenedicarboxylic acid (isophthalic acid) and diphenylether-4,4'-dicarboxylic acid (oxydibenzoic acid) are preferably used for the synthesis of the precursors. However, in general, those dicarboxylic acids that are used for the preparation of precursors of the above-mentioned type can be used.

Particularly suitable bis-o-aminophenols are 2,2-bis(3-amino-4-hydroxyphenyl)hexafluoropropane and 3,3'-dihydroxy-4,4'-diaminodiphenyl. The corresponding bis-o-aminothiophenols are used for the synthesis of poly-o-mercaptoamides. In principle, however, all bis-o-aminophenols and -thiophenols that are customarily used for the preparation of polybenzoxazole and polybenzothiazole precursors can be used.

The reaction of the dicarboxylic acid ester with the bis(thio)phenol takes place advantageously in the presence of a basic catalyst, which is preferably a tertiary amine. Catalysts of this type are, in particular, pyridine, triethylamine, diazabicyclooctane, and polyvinylpyridine. However, other basic catalysts can also be used, in which case preference is given to those that are readily soluble in the solvent used in the synthesis of the precursor, such as N-methylpyrrolidone, or are readily soluble in water or water/alcohol mixtures (precipitants), or those that are completely insoluble, such as cross-linked polyvinylpyridine.

The reaction temperature in the reaction between the ester and the (thio)phenol is preferably between about 20° C. and about 150° C. It has proved advantageous for the reaction selectivity to increase the temperature gradually. The process according to the invention is therefore carried out advantageously by dissolving the diester of the dicarboxylic acid, the bis-o-aminophenol or -thiophenol, and a basic catalyst at room temperature, optionally at elevated temperature, in an organic solvent and then gradually heating the reaction mixture. After the end of the reaction, the reaction solution is permitted to cool to room temperature and the reaction product is then precipitated with a suitable precipitant. After filtration and drying, the precipitated polymer is ready for use. The process according to the invention thus eliminates cumbersome purification steps, such as the purification of the polymer by means of an ion exchanger.

N-Methylpyrrolidone, tetrahydrofuran, and N,N-dimethylacetamide are suitable solvents. In principle, however, one can use any solvent in which the starting components are readily soluble. Particularly suitable precipitants are water and mixtures of water with alcohols, such as ethanol and isopropanol.

In the process according to the invention—in the presence of an excess of bis-o-aminophenol or -thiophenol—the amino end groups of the poly-o-hydroxyamide or -mercaptoamide produced can be capped, i.e., blocked, with a dicarboxylic acid anhydride before precipitation of the polymer. Cis-5-norbornene-endo-2,3-dicarboxylic acid anhydride is particularly suitable for this purpose.

DETAILED DESCRIPTION

The invention will be explained in greater detail by means of exemplifying embodiments.

EXAMPLE 1

Preparation of a PBO Precursor

The following are placed in a 250-ml three-necked flask under nitrogen (as a protective gas): 7.0 g of a diester of isophthalic acid and N-hydroxysuccinimide, 7.95 g of 2,2-bis(3-amino-4-hydroxyphenyl)hexafluoropropane, 3.95 g of triethylamine, and 105 ml of dry N-methylpyrrolidone. This mixture is then stirred for 8 hrs at room temperature and then for 8 hrs at 50° C. and 36 hrs at 80° C. After cooling to room temperature, 0.33 g of cis-5-norbornene-endo-2,3-dicarboxylic acid anhydride, dissolved in 2 ml of N-methylpyrrolidone, is added to block the end groups and the reaction solution is then stirred for another 14 hrs at room temperature. The reaction solution is then added dropwise, with vigorous stirring, to a tenfold quantity of a mixture of four parts by volume of water and one part by volume of isopropanol (as precipitant). The precipitated polymer is filtered off, washed four times with 200-ml portions of precipitant, treated with 1000 ml of precipitant, and stirred for 16 hrs. The polymer is then filtered off and dried first for 24 hrs at approximately 20 mbar and then for eight days at approximately 2 mbar, in each case at 50° C. The yield is 8.7 g.

EXAMPLE 2

Solubility of the PBO Precursor 1 g of the PBO precursor prepared according to Example 1 is dissolved in 3 g of diethylene glycol diethyl ether and the solution is placed in a plastic syringe equipped with a preliminary filter. The polymer solution is then applied by means of the syringe to a purified and dried silicon wafer and this is centrifuged in a centrifuge apparatus (Convac, type ST 146). The film formed on the wafer is dried at 120° C. on a hot plate. After cooling, the wafer coated with the polymer film is immersed in a commercially available aqueous alkaline developer free of metal ions (NSD-TD, Tokyo Ohka). During this process, the polymer film dissolves uniformly, i.e. without cracking and without flaking off. After only a short time, the whole polymer film is completely dissolved in the developer. The same result is obtained if, instead of the above-mentioned developer, a 3% solution of tetramethylammonium hydroxide in distilled water is used.

EXAMPLE 3

Photostructuring of the PBO Precursor 0.8 g of the PBO precursor prepared according to Example 1 and 0.2 g of a diester of naphthoquinonediazide-4-sulfonic acid and bisphenol-A (as a photoactive component) are dissolved in 3 g of diethylene glycol diethyl ether.-The resist solution obtained by this process is then applied to a silicon wafer and dried according to Example 2. One-half of the wafer is then covered with an aluminum foil and the other half is irradiated with a mercury/xenon lamp. The wafer is then immersed in a commercial developer solution according to Example 2. It is found that only the exposed regions are dissolved out selectively and uniformly (positive resist).

EXAMPLE 4

Preparation of a PBO Precursor

The following are placed in a 250-ml three-necked flask under nitrogen (as a protective gas): 12.0 g of a diester of diphenylether-4,4'-dicarboxylic acid and N-hydroysuccinimide, 10.8 g of 2,2-bis(3-amino-4-hydroxyphenyl)hexafluoropropane, 5.36 g of triethylamine, and 155 ml of dry N-methylpyrrolidone. This mixture is then stirred for 8 hrs at room temperature and then for 10 hrs at 50° C. and 25 hrs at 80° C. After cooling to room temperature, 0.44 g of cis-5-norbornene-endo-2,3-dicarboxylic acid anhydride, dissolved in 2.5 ml of N-methylpyrrolidone, is added to block the end groups and the reaction solution is then stirred for another 14 hrs at room temperature. The reaction solution is then added dropwise, with vigorous stirring, to a tenfold quantity of a mixture of four parts by volume of water and one part by volume of isopropanol (as a precipitant). The precipitated polymer is filtered off, washed four times with 200-ml portions of precipitant, treated with 1000 ml of precipitant and then stirred for 16 hrs. The polymer is then filtered off and dried first for 24 hrs at approximately 20 mbar and then for eight days at approximately 2 mbar, in each case at 50° C. The yield is 14.8 g.

EXAMPLE 5

Solubility of the PBO Precursor

If the procedure of Example 2 is used with the PBO precursor prepared according to Example 4, then the same result is obtained, i.e., the PBO precursor dissolves uniformly in both aqueous alkaline developers free of metal ions.

EXAMPLE 6

Photostructuring of the PBO Precursor

If the procedure of Example 3 is used with the PBO precursor prepared according to Example 4, then the same result is obtained, i.e. only the exposed regions are dissolved out selectively and uniformly.

What is claimed is:

1. A process for the preparation of poly-o-hydroxyamides and poly-o-mercaptoamides comprising the step of reacting a bis-o-aminophenol or a bis-o-amino-thiophenol with a dicarboxylic acid ester having the following structure:

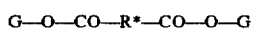

where:

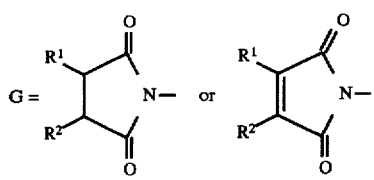

where
$R^1$ and $R^2$=H, F, $CH_3$, or $CF_3$ (independently of each other);

$R^*$ has the following meaning:
—$(CR_2)_m$, with R=H, F, $CH_3$, or $CF_3$ and m=1 to 10;

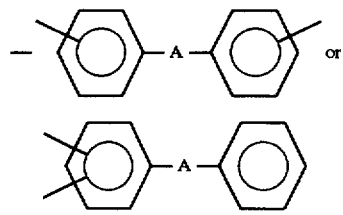

where $A=(CH_2)_n$, $(CF_2)_p$, $C(CH_3)_2$, $C(CF_3)_2$, $C(CH_3)(C_6H_5)$, $C(CF_3)(C_6H_5)$ $C(CF_3)$ $(C_6F_5)$, $C(C_6H_5)_2$, $CF_2$—$CF(CF_3)$ CH=CH, CF=CF, C≡C, O—$C_6H_4$—O, O, S, CO, or $SO_2$, where n=0 to 10 and p=1 to 10;

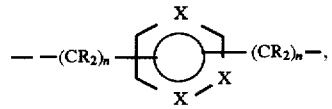

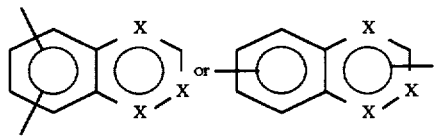

where

X=CH or N,
R=H, F, $CH_3$, or $CF_3$,
and n=0 to 10;

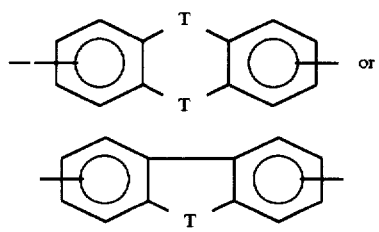

where T=$CH_2$, $CF_2$, CO, O, S, NH, or $N(CH_3)$;

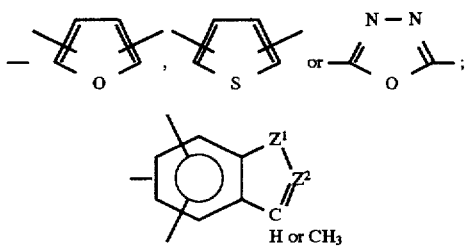

where $Z^1$=$CH_2$ or $CH(CH_3)$ and $Z^2$=CH or $C(CH_3)$
$Z^1$=$CH_2$ or $CH(CH_3)$ and $Z^2$=N $Z^1$=NH or N (CH$_3$) and $Z^2$=CH or C(CH$_3$)
$Z^1$=NH or N(CH$_3$) and $Z^2$=N

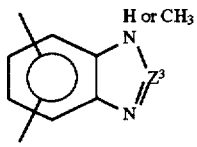

where $Z^3$=CH, C(CH$_3$), or N

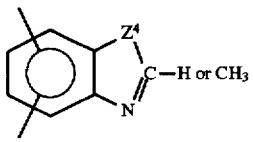

where $Z^4$=O or S; where, in each case, all hydrogen atoms (H) in all aromatic partial structures can be replaced by fluorine (F).

2. The process according to claim 1, wherein the dicarboxylic acid ester is an ester of dicarboxylic acid and N-hydroxysuccinimide.

3. The process according to claim 1, wherein the reaction is carried out in the presence of a basic catalyst.

4. The process according to claim 2, wherein the reaction is carried out in the presence of a basic catalyst.

5. The process according to claim 3, wherein the catalyst is a tertiary amine.

6. The process according to claim 4, wherein the catalyst is a tertiary amine.

7. The process according to claim 1, wherein the reaction is carried out at temperatures of from about 20° C. to about 150° C.

8. The process according to claim 2, wherein the reaction is carried out at temperatures of from about 20° C. to about 150° C.

9. The process according to claim 7, wherein the temperature is increased gradually.

10. The process according to claim 8, wherein the temperature is increased gradually.

* * * * *